United States Patent
Wang et al.

(10) Patent No.: US 11,818,908 B2
(45) Date of Patent: Nov. 14, 2023

(54) THIN FILM ELECTROLUMINESCENT DEVICE, PREPARATION METHOD THEREOF, AND ELECTRONIC DEVICE

(71) Applicants: WUHAN CHINA STAR OPTOELECTRONICS SEMICONDUCTOR DISPLAY TECHNOLOGY CO., LTD., Hubei (CN); GUANGZHOU CHINARAY OPTOELECTRONIC MATERIALS LTD., Guangdong (CN)

(72) Inventors: Xu Wang, Hubei (CN); Yue Zhang, Hubei (CN); Xianjie Li, Hubei (CN); Munjae Lee, Hubei (CN); Tao Li, Hubei (CN); Junyou Pan, Hubei (CN); Jiahui Tan, Hubei (CN); Xi Yang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 615 days.

(21) Appl. No.: 16/971,058

(22) PCT Filed: Sep. 29, 2019

(86) PCT No.: PCT/CN2019/108903
§ 371 (c)(1),
(2) Date: Aug. 19, 2020

(87) PCT Pub. No.: WO2021/003856
PCT Pub. Date: Jan. 14, 2021

(65) Prior Publication Data
US 2021/0143355 A1    May 13, 2021

(30) Foreign Application Priority Data

Jul. 5, 2019 (CN) .......................... 201910603093.X

(51) Int. Cl.
*H01L 51/00* (2006.01)
*H10K 50/12* (2023.01)
(Continued)

(52) U.S. Cl.
CPC ............. *H10K 50/12* (2023.02); *H10K 50/15* (2023.02); *H10K 50/16* (2023.02); *H10K 50/171* (2023.02);
(Continued)

(58) Field of Classification Search
None
See application file for complete search history.

(56) References Cited

U.S. PATENT DOCUMENTS

2011/0121271 A1* 5/2011 Jeon ................... H10K 50/844
257/40
2014/0138636 A1 5/2014 Song
(Continued)

FOREIGN PATENT DOCUMENTS

CN    105374847 A    3/2016
CN    106129266 A    11/2016
(Continued)

OTHER PUBLICATIONS

Machine translation of KR-20190008073, translation generated Mar. 2023, 14 pages. (Year: 2023).*
(Continued)

Primary Examiner — Robert S Loewe
(74) Attorney, Agent, or Firm — PV IP PC; Wei Te Chung; Zhigang Ma

(57) ABSTRACT

A thin film electroluminescent device, a preparation method thereof, and an electronic device are provided. The thin film
(Continued)

electroluminescent device includes a first electrode, a functional structural layer disposed on the first electrode, a second electrode disposed on the functional structural layer, and a cover layer disposed on a side of the second electrode away from the first electrode. The cover layer includes an ionic compound having a chemical formula of $AX_2$, wherein A is selected from divalent metal, and X is selected from halogen.

9 Claims, 1 Drawing Sheet

(51) Int. Cl.
    *H10K 50/15*     (2023.01)
    *H10K 50/16*     (2023.01)
    *H10K 50/17*     (2023.01)
    *H10K 71/00*     (2023.01)
    *H10K 85/60*     (2023.01)

(52) U.S. Cl.
    CPC ......... *H10K 71/00* (2023.02); *H10K 85/6572* (2023.02)

(56) References Cited

U.S. PATENT DOCUMENTS

| | | | |
|---|---|---|---|
| 2016/0329521 A1* | 11/2016 | Kim | H10K 50/858 |
| 2016/0343990 A1 | 11/2016 | Song | |
| 2016/0380235 A1* | 12/2016 | Kim | H10K 85/6576 |
| | | | 257/40 |
| 2019/0273220 A1* | 9/2019 | Kim | H10K 50/858 |

FOREIGN PATENT DOCUMENTS

| | | | | |
|---|---|---|---|---|
| CN | 106298848 A | | 1/2017 | |
| CN | 108511630 A | | 9/2018 | |
| CN | 109400488 A | | 3/2019 | |
| KR | 20190008073 A | * | 1/2019 | ............. C09K 11/06 |

OTHER PUBLICATIONS

Tyagi, Pankaj, and A. G. Vedeshwar. "Optical properties of Znl 2 films." Physical Review B 64.24 (2001): 245406. (Year: 2001).*

* cited by examiner

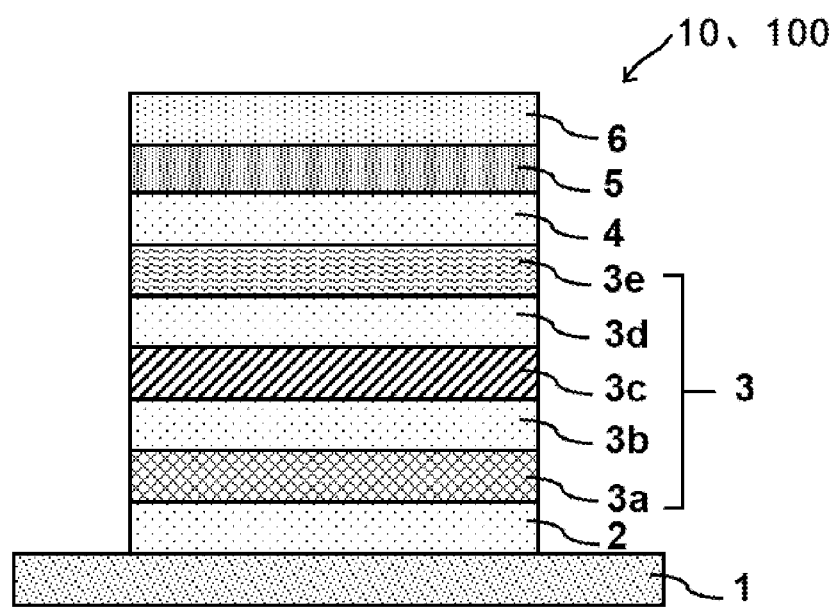

THIN FILM ELECTROLUMINESCENT DEVICE, PREPARATION METHOD THEREOF, AND ELECTRONIC DEVICE

FIELD OF INVENTION

The present disclosure relates to the field of display technologies, and more particularly to a thin film electroluminescent device, a preparation method thereof, and an electronic device.

BACKGROUND OF INVENTION

Electroluminescence display devices are a type of self-luminous display devices that emit excitons by transfer and recombination of carriers between functional layers and emit light by high quantum efficiency organic compounds or metal complexes. Electroluminescence display devices have characteristics of self-illumination, high brightness, high efficiency, high contrast, and high responsiveness.

In recent years, the luminous efficiency of organic electroluminescent diodes (OLEDs) have been greatly improved, but their internal quantum efficiency has approached a theoretical limit. Therefore, improving light extraction efficiency is an effective means for further improving device stability and current efficiency (such as stacking of metal complexes of an emissive layer, matching of refractive indices between functional layers, etc.) In 2003, Riel et al. attempted to vaporize inorganic compounds with high refractive index, such as zinc selenide, on a cathode, using a difference in refractive index between functional layers to improve light extraction efficiency, but limited by evaporation of inorganic materials. Such compounds do not find more applications in thin film electroluminescent devices due to high temperatures and slow evaporation rates. For high-energy plasma or ultraviolet light that is exposed in subsequent packages of the devices, a more stable type of material is needed to avoid damage to internal materials of the electroluminescent devices.

Therefore, a class of compounds that improve stability of electroluminescent devices and device preparation efficiency require further screening.

SUMMARY OF INVENTION

In order to solve the above technical problems, the present invention provides a thin film electroluminescent device, a preparation method thereof, and an electronic device, which are provided by vacuum evaporation of a cover layer having an ionic compound on the thin film electroluminescent device to improve luminous efficiency of the thin film electroluminescent device, while reducing difficulty of preparation of the thin film electroluminescent device.

A technical solution to solve the above technical problems is that an embodiment of the present invention provides a thin film electroluminescent device. The thin film electroluminescent device includes a first electrode, a functional structural layer disposed on the first electrode, a second electrode disposed on the functional structural layer, and a cover layer disposed on a side of the second electrode away from the first electrode. The cover layer includes an ionic compound having a chemical formula of AX2, wherein A is selected from divalent metal, and X is selected from halogen.

In an embodiment of the present invention, the divalent metal is one of zinc, magnesium, and tin, and the halogen is one of fluorine, chlorine, bromine, and iodine.

In an embodiment of the present invention, the cover layer has an extinction coefficient of visible light of 0.1 or less and a transmittance of visible light of 70% or more.

In an embodiment of the present invention, the thin film electroluminescent device further includes a light extraction layer disposed between the second electrode and the cover layer, the cover layer is vacuum evaporated on the light extraction layer on a side of the light extraction layer away from the second electrode, and material for the light extraction layer comprises at least one selected from a group consisting of the ionic compound, carbazole derivative, diphenylfuran derivative, arylamine derivative, and triazine derivative.

In an embodiment of the present invention, material for the first electrode and material of the second electrode include at least one of metal or a compound thereof, metal alloy, and conductive polymer.

In an embodiment of the present invention, the functional structural layer includes a hole injection layer disposed on the first electrode, a hole transport layer disposed on the hole injection layer, a light emitting layer disposed on the hole transport layer, an electron transport layer disposed on the light emitting layer, an electron injection layer disposed on the electron transport layer, and the second electrode disposed on the electron injection layer.

In an embodiment of the present invention, the light emitting layer has a host material and a dopant material, the host material has the following structural formula:

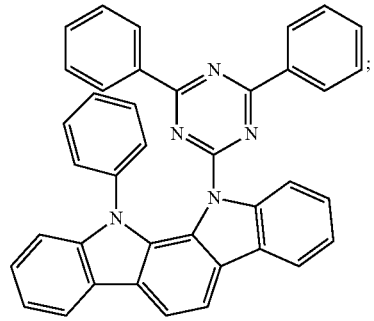 [SMILES: c1ccc(-c2nc(-c3ccccc3)nc(-n3c4ccccc4c4ccc5c6ccccc6n(-c6ccccc6)c5c43)n2)cc1]

the doping material has the following structural formula:

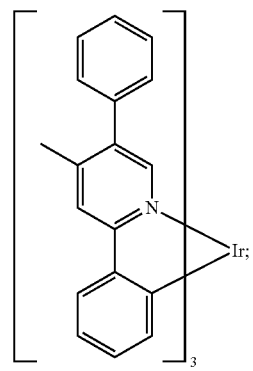

a mass ratio of the host material to the dopant material is 7:1:–9:1.

An embodiment of the present invention further provides a preparation method for preparing the above thin film electroluminescent device. The method includes providing a conductive glass having the first electrode on a surface of the conductive glass, forming, by vacuum evaporation, the functional structural layer on the surface of the conductive glass having the first electrode, forming, by vacuum evaporation, the second electrode on a side of the functional structure layer away from the first electrode, and forming, by vacuum evaporation, the cover layer on the side of the second electrode away from the first electrode. The cover layer includes the ionic compound having the chemical formula of AX2, wherein A is selected from the divalent metal, and X is selected from the halogen.

In an embodiment of the present invention, providing the conductive glass includes sequentially ultrasonically washing the conductive glass using deionized water, acetone, or isopropanol, and then washing the conductive glass using a plasma cleaner, and forming the functional structure layer includes sequentially forming a hole injection layer, a hole transport layer, alight emitting layer, an electron transport layer, and an electron injection layer by vacuum evaporation.

An embodiment of the present invention further provides an electronic device including the above thin film electroluminescent device.

Beneficial effects of an embodiment of the present disclosure are that, an embodiment of the present invention provides the thin film electroluminescent device, the preparation method thereof and the electronic device effectively that improve the luminous efficiency of the thin film electroluminescent device by providing a cover layer on a cathode, the cover layer has the ionic compound, and the ionic compound is a halide, in particularly, It is effective for reducing difficulty of the preparation of the thin film electroluminescent device for bromide or chloride.

DESCRIPTION OF DRAWINGS

In order to more clearly illustrate the embodiments or the technical solutions in the prior art, the drawings used in the embodiments or the description of the prior art will be briefly described below. Obviously, the drawings in the following description are only for the application. For some embodiments, other drawings may be obtained from those of ordinary skill in the art without departing from the drawings.

The invention is further explained below in conjunction with the drawings and embodiments.

The FIGURE is a structural view of a thin film electroluminescent device according to an embodiment of the present invention.

10 thin film electroluminescent device; 100 electronic device;
1 conductive glass; 2 first electrode;
3 functional structural layer; 4 second electrode;
5 light extraction layer; 6 cover layer;
3a hole injection layer; 3b hole transport layer;
3c light emitting layer; 3d electron transport layer;
3e electron injection layer.

DETAILED DESCRIPTION OF PREFERRED EMBODIMENTS

The embodiments of the present invention are described in detail below, and the examples of the embodiments are illustrated in the drawings, wherein the same or similar reference numerals indicate the same or similar elements or elements having the same or similar functions. The embodiments described below with reference to the drawings are intended to be illustrative of the invention and are not to be construed as limiting.

The following description of the various embodiments is provided to illustrate the specific embodiments of the present disclosure. Directional terms mentioned in this application, such as "upper", "lower", "front", "back", "left", "right", "top", "bottom", etc., only refer to the orientation of the drawings. Therefore, the directional terms used are used to describe and understand the present disclosure and are not intended to limit the present disclosure.

As shown in the FIGURE, in an embodiment of the present invention, a thin film electroluminescent device 10 of the present invention includes a first electrode 2, a functional structure layer 3, a second electrode 4, a light extraction layer 5, and a cover layer 6.

The first electrode 2 is disposed on one side of the conductive glass 1, and the first electrode 2 is an anode. The functional structure layer 3 includes a hole injection layer 3a, a hole transport layer 3b, and alight emitting layer 3c. The hole injection layer 3a is disposed on the first electrode 2, the hole transport layer 3b is disposed on the hole injection layer 3a, and the light emitting layer 3c is disposed on the hole transport layer 3b. The second electrode 4 is directly disposed on the light emitting layer 3c, and the second electrode 4 is a cathode.

In this embodiment, the functional structure layer 3 may further include an electron transport layer 3d and an electron injection layer 3e. The electron transport layer 3d is disposed on the light emitting layer 3c, and the electron injection layer 3e is disposed on the electron transport layer 3d. The second electrode 4 is disposed on the electron injection layer 3e.

In this embodiment, an electronic blocking layer (not shown) may be disposed in the functional structure layer 3 between the first electrode 2 and the second electrode 4. For example, it may be disposed between the light emitting layer 3c and the hole transport layer 3b such that when a current is applied between the anode and the cathode, the electron blocking layer prevents electrons from leaking in the light emitting layer 3c.

In this embodiment, a hole blocking layer (not shown) may be disposed in the functional structure layer 3 between the first electrode 2 and the second electrode 4. For example, it may be disposed between the electron transport layer 3d and the light emitting layer 3c such that when a current is applied between the anode and the cathode, the hole blocking layer is capable of confining carriers and excitons to the light emitting layer 3c.

Since the anode can easily inject holes into the hole injection layer 3a or the hole transport layer 3b or the light emitting layer 3c, an absolute value of the difference of a HOMO level or a valence band level between a work function of the anode and an illuminant in the light emitting layer 3c or a p-type semiconductor material of the hole injection layer 3a or the hole transport layer 3b or the hole injection layer 3a or the electron blocking layer is less than 0.5 eV, preferably less than 0.2 eV.

The anode material may be selected from a conductive metal or a metal oxide or a conductive polymer, for example, aluminum copper, gold, silver, magnesium, iron, cobalt, nickel, molybdenum, palladium, platinum, indium tin oxide, aluminum doped zinc oxide, etc. Other suitable anode materials are known and can be readily selected for use by one of ordinary skill in the art. The anode material can be deposited using any suitable technique, such as a suitable physical vapor deposition process, including RF magnetron sputtering, vacuum thermal evaporation, electron beam (e-beam) deposition methods, and the like. The anode is patterned and structured. Patterned indium tin oxide conductive glass 1 is commercially available and can be used to prepare the devices of the present invention.

The cathode may be selected from a conductive metal or metal oxide or a metal alloy or a conductive polymer. In principle, all materials which can be used as the cathode of the thin film electroluminescent device 10 are possible as cathode materials for the thin film electroluminescent device 10 of the invention, for example: aluminum, gold, silver, calcium, barium, magnesium, fluorinated Lithium and aluminum, magnesium silver alloy, barium fluoride and aluminum, copper, iron, cobalt, nickel, molybdenum, palladium, platinum, indium tin oxide, and the like. The cathode can easily inject electrons into the electron injection layer $3e$ or the electron transport layer $3d$ or directly into the light emitting layer $3c$. In an embodiment, an absolute value of the difference of a LUMO level or a conduction band level between a work function of the cathode and an illuminant in the light emitting layer $3c$ or a n-type semiconductor material of the electron injection layer $3e$ or the electron transport layer $3d$ or the hole blocking layer is less than 0.5 eV, preferably less than 0.2 eV. The cathode material can be deposited using any suitable technique, such as a suitable physical vapor deposition process, including RF magnetron sputtering, vacuum thermal evaporation, electron beam (e-beam) deposition methods, and the like.

The light emitting layer $3c$ is an organic emitting layer $3c$ in which an organic luminescent material is doped, and the organic luminescent material is selected from a singlet illuminant, a triplet illuminant or a thermally activated delayed fluorescent luminescent material (TADF).

The quantum dot luminescent materials, singlet illuminants, triplet illuminants, and thermally activated delayed fluorescent luminescent materials (TADF) are described in more detail below.

Quantum Dot Luminescent Material

Luminescent quantum dots can illuminate at wavelengths between 380 nanometers and 2500 nanometers. For example, it has been found that the luminescent wavelength of a quantum dot having a CdS core is in the range of about 400 nm to 560 nm; the luminescent wavelength of a quantum dot having a CdSe core is in the range of about 490 nm to 620 nm; the luminescent wavelength of a quantum dot having a CdTe core is in the range of about 620 nm to 680 nm; the luminescent wavelength of a quantum dot having a InGaP core is in the range of about 600 nm to 700 nm; the luminescent wavelength of a quantum dot having a PbS core is in the range of about 800 nm to 2500 nm; the luminescent wavelength of a quantum dot having a PbSe core is in the range of about 1200 nm to 2500 nm; the luminescent wavelength of a quantum dot having a CuInGaS core is in the range of about 600 nm to 680 nm; and the luminescent wavelength of a quantum dot having a ZnCuInGaS core is in the range of about 500 nm to 620 nm; the luminescent wavelength of a quantum dot having a CuInGaSe core in the range of about 700 nm to 1000 nm.

In this embodiment, quantum dot material includes at least one blue light having a peak wavelength of 450 nm to 460 nm, or green light having a peak wavelength of 520 nm to 540 nm, or red light having a peak wavelength of 615 nm to 630 nm, or a mixture of them.

The quantum dots contained may be selected from a particular chemical composition, topographical structure, and/or size to achieve light that emits the desired wavelength under electrical stimulation. The narrow particle size distribution of quantum dots enables quantum dots to have a narrower luminescence spectrum. Furthermore, depending on the chemical composition and structure employed, the size of the quantum dots needs to be adjusted accordingly within the above-described size range to achieve the luminescent properties of the desired wavelength.

The quantum dots are semiconductor nanocrystals. The size of the semiconductor nanocrystals ranges from about 5 nanometers to about 15 nanometers. Furthermore, depending on the chemical composition and structure employed, the size of the quantum dots needs to be adjusted accordingly within the above-described size range to achieve the luminescent properties of the desired wavelength.

The semiconductor nanocrystal includes at least one semiconductor material, wherein the semiconductor material may be selected from Group IV, II-VI, II-V, III-V, III-VI, IV-VI, I-III-VI, II-IV-VI, II-IV-V binary or multi-component semiconductor compounds or mixtures thereof of the periodic table. Examples of specific semiconductor materials include, but are not limited to, Group IV semiconductor compounds composed of elemental Si, Ge, C, and binary compounds SiC, SiGe; Group II-VI semiconductor compounds, including binary compounds including CdSe, CdTe, CdO, CdS, CdSe, ZnS, ZnSe, ZnTe, ZnO, HgO, HgS, HgSe, HgTe, ternary compounds including CdSeS, CdSeTe, CdSTe, CdZnS, CdZnSe, CdZnTe, CgHgS, CdHgSe, ZnSeS, ZnSeTe, ZnSTe, HgSeS, HgSeTe, HgSTe, HgZnS, HgSeSe, and quaternary compounds including CgHgSeS, CdHgSeTe, CgHgSTe, CdZnSeS, CdZnSeTe, HgZnSeTe, HgZnSTe, CdZnSTe, HgZnSeS; Group III-V semiconductor compound including binary compounds including AlN, AlP, AlAs, AlSb, GaN, GaP, GaAs, GaSb, InN, InP, InAs, InSb, ternary compounds including AlNP, AlNAs, AlNSb, AlPAs, AlPSb, GaNP, GaNAs, GaNSb, GaPAs, GaPSb, InNP, InNAs, InNSb, InPAs, InPSb, and quaternary compounds including GaAlNAs, GaAlNSb, GaAlPAs, GaInNP, GaInNAs, GaInNSb, GaInPAs, GanPSb, InAlNP, InAlNAs, InAlNSb, InAlPAs, InAlPSb; Group IV-VI semiconductor compound including a binary compound including SnS, SnSe, SnTe, PbSe, PbS, PbTe, and a ternary compound including SnSeS, SnSeTe, SnSTe, SnPbS, SnPbSe, SnPbTe, PbSTe, PbSeS, PbSeTe, and quaternary compounds including SnPbSSe, SnPbSeTe, SnPbSTe.

The quantum dots may comprise a Group II-VI semiconductor material, preferably selected from the group consisting of CdSe, CdS, CdTe, ZnO, ZnSe, ZnS, ZnTe, HgS, HgSe, HgTe, CdZnSe, and any combination thereof. In a suitable embodiment, this material is used for luminescent quantum dots of visible light due to the relatively mature synthesis of CdSe.

The quantum dots may also comprise a Group III-V semiconductor material, preferably selected from the group consisting of InAs, InP, InN, GaN, InSb, InAsP, InGaAs, GaAs, GaP, GaSb, AlP, AlN, AlAs, AlSb, CdSeTe, ZnCdSe and any combination of them.

The quantum dots may also comprise an IV-VI semiconductor material, preferably selected from the group consisting of PbSe, PbTe, PbS, PbSnTe, Tl2SnTe5, and any combination thereof.

The quantum dot is a core-shell structure. The core and the shell respectively comprise one or more semiconductor materials, either identically or differently.

The core of the quantum dot may be selected from the group IV, II-VI, II-V, III-V, III-VI, IV-VI, I-III-VI, II-IV-VI, II-IV-V binary or multi-component semiconductor compound of the periodic table of the Elements. Specific examples for quantum dot core include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, An alloy or mixture of HgTe, InAs, InN, InSb, AlAs, AlN, AlP, AlSb, PbO, PbS, PbSe, PbTe, Ge, Si, and any combination thereof.

The shell of the quantum dot is selected from the same or different semiconductor materials of the core. Semiconductor materials that can be used for the shell include Group IV, II-VI, II-V, III-V, III-VI, IV-VI, I-III-VI, II-IV-VI, II-IV-V binary or multi-component semiconductor compounds of the periodic table of the Elements. Specific examples for quantum dot core include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, An alloy or mixture of HgTe, InAs, InN, InSb, AlAs, AlN, AlP, AlSb, PbO, PbS, PbSe, PbTe, Ge, Si, and any combination thereof.

The quantum dots having a core-shell structure may include a single layer or a multilayer structure. The shell includes one or more semiconductor materials that are the same or different from the core. In a preferred embodiment, the shell has a thickness of from about 1 to 20 layers. In a more preferred embodiment, the shell has a thickness of about 5 to 10 layers. In some embodiments, two or more shells are included on the surface of the quantum dot core. The semiconductor material used for the shell has a larger band gap than the core. Particularly preferred, the core nucleus has a type I semiconductor heterojunction structure. The semiconductor material used for the shell has a smaller band gap than the core. The semiconductor material used for the shell has an atomic crystal structure that is the same as or close to the core. Such a choice is beneficial to reduce the stress between the core shells and make the quantum dots more stable. The core-shell quantum dots used are (but not limited to):

Red light: CdSe/CdS, CdSe/CdS/ZnS, CdSe/CdZnS, etc.
Green light: CdZnSe/CdZnS, CdSe/ZnS, etc.
Blue light: CdS/CdZnS, CdZnS/ZnS, etc.

A preferred method of preparing quantum dots is a colloidal growth method. In a preferred embodiment, the method of preparing monodisperse quantum dots is selected from the group consisting of hot-inject and/or heating-up.

In this embodiment, the surface of the quantum dot may optionally contain an organic ligand. Organic ligand can control the growth process of quantum dots, regulate the appearance of quantum dots, and reduce surface defects of quantum dots to improve the luminous efficiency and stability of quantum dots. The organic ligand may be selected from the group consisting of pyridine, pyrimidine, furan, amine, alkylphosphine, alkylphosphine oxide, alkylphosphonic acid or alkylphosphinic acid, alkyl mercaptan and the like. Examples of specific organic ligand includes, but are not limited to, tri-n-octylphosphine, tri-n-octylphosphine oxide, trihydroxypropylphosphine, tributylphosphine, tris(dodecyl)phosphine, dibutyl phosphite, tributyl phosphite, octadecyl phosphite, trilauryl phosphite, tris(dodecyl) phosphite, triisodecyl phosphite, bis(2-ethylhexyl) phosphate, Tris(tridecyl)phosphate, hexadecylamine, oleylamine, octadecylamine, bisoctadecylamine, octadecylamine, bis(2-ethylhexyl)amine, octylamine, dioctylamine, trioctane Amine, dodecylamine, dodecylamine, tridodecylamine, hexadecylamine, phenylphosphoric acid, hexylphosphoric acid, tetradecylphosphoric acid, octylphosphoric acid, n-octadecylphosphoric acid, propylene diphosphate, dioctyl ether, diphenyl ether, octyl mercaptan, dodecyl mercaptan.

In this embodiment, the surface of the quantum dot may also optionally contain an inorganic ligand. Quantum dots protected by inorganic ligand can be obtained by ligand exchange of organic ligand on the surface of quantum dots. Examples of specific inorganic ligand includes, but are not limited to, S2-, HS—, Se2-, HSe—, Te2-, HTe—, TeS32-, OH—, NH2-, PO43-, MoO42-, and the like. Examples of such inorganic ligand quantum dots can be found in J. Am. Chem. Soc. 2011, 133, 10612-10620; ACS Nano, 2014, 9, 9388-9402. The entire contents of the above-listed documents are hereby incorporated by reference.

The quantum dot surface has one or more of the same or different ligands.

The luminescence spectrum exhibited by the monodisperse quantum dots has a symmetrical peak shape and a narrow half width. In general, the better the monodispersity of quantum dots, the more symmetric the luminescence peaks are and the narrower the half-width. Preferably, the quantum dots have a full width at half maximum of less than 70 nanometers; more preferably, the quantum dots have a full width at half maximum of less than 40 nanometers; most preferably, the quantum dots have a full width at half maximum of less than 30 nanometers.

The quantum dots have a luminescent quantum efficiency of 10% to 100%. Preferably, the quantum dots have a luminescence quantum efficiency greater than 50%; more preferably, the quantum dots have a luminescence quantum efficiency greater than 80%; most preferably, the quantum dots have aluminescence quantum efficiency greater than 90%.

Singlet Illuminant

Singlet illuminant r tend to have longer conjugated pi-electron systems. Heretofore, there have been many examples, such as the styrylamines and derivatives thereof disclosed in JP2913116B and WO2001021729A1, the indenoindenes and derivatives thereof disclosed in WO2008/00644 and WO2007/140847, and a triarylamine derivative of ruthenium disclosed in U.S. Pat. No. 7,233,019, KR2006-0006760.

The singlet illuminant may be selected from the group consisting of monostyrylamine, dibasic styrylamine, ternary styrylamine, quaternary styrylamine, styrene phosphine, styrene ether and arylamine. A monostyrylamine refers to a compound comprising an unsubstituted or substituted styryl group and at least one amine, preferably an aromatic amine. A dibasic styrylamine refers to a compound comprising two unsubstituted or substituted styryl groups and at least one amine, preferably an aromatic amine. A ternary styrylamine refers to a compound comprising three unsubstituted or substituted styryl groups and at least one amine, preferably an aromatic amine. A quaternary styrylamine refers to a compound comprising four unsubstituted or substituted styryl groups and at least one amine, preferably an aromatic amine. A preferred styrene is stilbene, which may be further substituted. The corresponding phosphines and ethers are defined similarly to amines. An arylamine or an aromatic amine refers to a compound comprising three unsubstituted or substituted aromatic ring or heterocyclic systems directly bonded to a nitrogen. At least one of these aromatic or heterocyclic ring systems is preferably selected from the fused ring system and preferably has at least 14 aromatic ring atoms. Preferred examples thereof are aromatic decylamine, aromatic quinone diamine, aromatic decylamine, aromatic quinone diamine, aromatic thiamine and aromatic quinone diamine. An aromatic amide refers to a compound in which a diaryl arylamine group is attached directly to the oxime, preferably at the position of 9. An aromatic quinone diamine refers to a compound in which two diaryl arylamine groups are attached directly to the oxime, preferably at the 9,10 position. The aromatic decylamine, the aromatic quinone diamine, the aromatic thiamine, and the aromatic thiamine are similarly defined, wherein the diarylamine group is preferably bonded to the 1 or 1, 6 position of the oxime.

The singlet illuminant can be selected from the indoleamine and anthraquinone-diamine, ruthenium-based fused ring systems, ruthenium derivatives, ruthenium triarylamine derivatives, and other triarylamine derivatives having a specific structure of ruthenium. Other materials which can be used as singlet emitters are polycyclic aromatic hydrocarbon compounds, in particular derivatives of the following compounds: for example, 9,10-bis(2-naphthoquinone), naphthalene, tetraphenyl, xanthene, phenanthrene, pyrene (such as 2,5,8,11-tetra-t-butyl fluorene), anthracene, phenylene (4,4'-bis(9-ethyl-3-carbazolevinyl)-1, 1'-biphenyl), indenyl fluorene, decacycloolefin, hexacene benzene, anthracene, spirobifluorene, aryl hydrazine, arylene vinyl, cyclopentadiene such as tetraphenylcyclopentadiene, Rubrene, coumarin, rhodamine, quinacridone, pyran such as 4 (dicyanomethylidene)-6-(4-p-dimethylaminostyryl-2-methyl)-4H-pyran (DCM), thiopyran, bis(azinyl)imine boron compound, bis(pyridazinyl)methylene compound, quinolone compound, oxazinone, benzoxazole, benzothiazole, benzimidazole, and pyrrolopyrroledione.

Triplet Illuminant

Triplet illuminant is also known as phosphorescent emitters. A triplet illuminant is a metal complex having the general formula M(L)n, wherein M is a metal atom, and each time L can be the same or different, it is an organic ligand that passes through one or more positions. Bonding or coordination is attached to the metal atom M, and n is an integer between 1 and 6. Preferentially, the triplet emitter comprises a chelating ligand, i.e. a ligand, coordinated to the metal by at least two bonding sites, with particular preference being given to the triplet emitter comprising two or three identical or different pairs tooth or multidentate ligand. Chelating ligands are beneficial for increasing the stability of metal complexes.

The metal complex which can be used as the triplet illuminant has the following form: the metal atom M is selected from a transition metal element or a lanthanoid or a lanthanoid element, and preferably ruthenium, platinum, palladium, gold, rhodium, ruthenium, osmium, iridium, copper, silver, nickel, cobalt, tungsten or rhenium, especially preferred for bismuth, gold, platinum, tungsten or rhenium.

Thermally Activated Delayed Fluorescent Luminescent Material (TADF)

Traditional organic fluorescent materials can only use 25% singlet excitons formed by electrical excitation, and the internal quantum efficiency of the device is low (up to 25%). Although the phosphorescent material enhances the intersystem traversal due to the strong spin-orbit coupling of the center of the heavy atom, it can effectively utilize the singlet excitons and triplet exciton luminescence formed by electrical excitation, so that the internal quantum efficiency of the device reaches 100%. However, the issues of expensive phosphorescent materials, poor material stability, and severe roll-off of device efficiency limit their application in OLEDs. The thermally activated delayed fluorescent luminescent material is a third generation organic luminescent material developed after organic fluorescent materials and organic phosphorescent materials. Such materials generally have a small singlet-triplet energy level difference ($\Delta E_{st}$), and triplet excitons can be converted into singlet exciton luminescence by anti-intersystem crossing. This can make full use of the singlet excitons and triplet excitons formed under electrical excitation. The quantum efficiency in the device can reach 100%. At the same time, the material structure is controllable, the property is stable, the price is low, no precious metal is needed, and the application prospect in the OLED field is broad.

The thermally activated delayed fluorescent luminescent material (TADF) needs to have a small singlet-triplet energy level difference, preferably $\Delta E_{st}<0.3$ eV, preferably $\Delta E_{st}<0.2$ eV (second best), preferably $\Delta E_{st}<0.1$ eV (the best), the existing heat activated delayed fluorescent luminescent material (TADF) can be used in the thermally activated delayed fluorescent luminescent material (TADF) of the present invention to provide the light emitting layer 3c with better fluorescence quantum efficiency.

The light extraction layer 5 is disposed on a side of the second electrode 4 away from the first electrode 2. The light extraction layer 5 needs to have a suitable energy level structure. In this embodiment, the singlet state energy (S1) of the light extraction layer 5 is greater than or equal to 2.7 eV and less than or equal to 3.1 eV; preferably, greater than or equal to 2.85 eV, less than or equal to 3.0 eV. In areas with wavelengths less than 400 nm, there is strong absorption. Visible light with wavelengths greater than 400 nm absorbs weak or near zero, which prevents the internal materials of the device from being damaged by high-energy light in the subsequent process.

The light extraction layer 5 requires a smaller extinction coefficient, and the extinction coefficient at a wavelength of 430 nm is less than 0.1; preferably, less than 0.003. More preferably, it is less than 0.001. It has a high transmittance for visible light and reduces the effect on the light extraction efficiency of the device. The light extraction layer 5 has a large extinction coefficient in a wavelength range of ≤400 nm; preferentially, the extinction coefficient at a wavelength of 350 nm is ≥0.3; preferably ≥0.5, more preferably ≥0.7 (second best), preferably ≥1.0 (the best).

The light extraction layer 5 has a high refractive index and can beneficially derive the emission of visible light, thereby improving the luminous efficiency of the organic electronic light-emitting device. When the reflectance of the interface between the material of the light extraction layer 5 and the adjacent electrode is large, the influence of the light interference is large, and therefore the refractive index of the material constituting the light extraction layer 5 is preferably larger than the refractive index of the adjacent electrode. The light extraction layer 5 has a refractive index greater than 1.5 in the visible range (400 nm to 800 nm). In this embodiment, the light extraction layer 5 has a refractive index greater than 1.7 at a wavelength of 630 nm; more preferably greater than 1.8; and most preferably greater than 1.9.

The light extraction layer 5 has a thickness of 10 nm to 200 nm; and the light extraction layer 5 has a thickness of 20 nm to 150 nm, preferably 30 nm to 100 nm, more preferably 40 nm to 90 nm.

The light extraction layer 5 has a high glass transition temperature, and improves the thermal stability of the material of the light extraction layer 5, and the glass transition temperature Tg≥100° C., optionally Tg≥120° C., Tg≥140° C., Tg≥160° C., Tg≥180° C.

In this embodiment, the material of the light extraction layer 5 may be selected from the group consisting of a carbazole derivative, a diphenylfuran derivative, an arylamine derivative, a triazine derivative, and the like, and an organic compound containing the following structural formula:

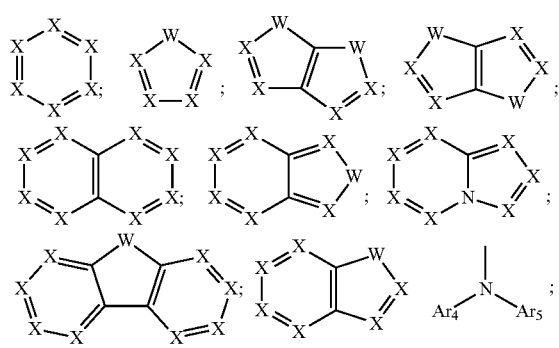

In the above structural formula, X is CR1 or N; and W is selected from the group consisting of CR2R3, NR4, C(=O), O, S, Se or the like.

Ar4 and Ar5 are selected from a substituted or unsubstituted aromatic group or heteroaromatic group having 5 to 60 ring atoms; or a substituted or unsubstituted non-aromatic ring system having 3 to 25 ring atoms.

Each occurrence of R1-R4 is independently selected from hydrogen or a linear alkyl group having 1 to 30 C atoms, an alkoxy group or a thioalkoxy group, or a branch or ring having 3 to 30 C atoms, or an alkyl, alkoxy or thioalkoxy group, or a silyl group, or a ketone group having 1 to 30 C atoms, or an alkoxycarbonyl group having 2 to 30 C atoms, or having 7 to 30 C atom aryloxycarbonyl group, cyano group (—CN), carbamoyl group (—C(=O)NH2), haloformyl group, formyl group (—C(=O)—H), isocyano group, isocyanate, thiocyanate or isothiocyanate, hydroxyl, nitro, CF3, Cl, Br, F, crosslinkable group, or substituted or unsubstituted aryl having 5 to 60 ring atoms, or a heteroaromatic group, or an aryloxy or heteroaryloxy group having from 5 to 60 ring atoms, or a combination of these systems.

In this embodiment, the light extraction layer 5 material may also select one or a combination of the following group of compounds:

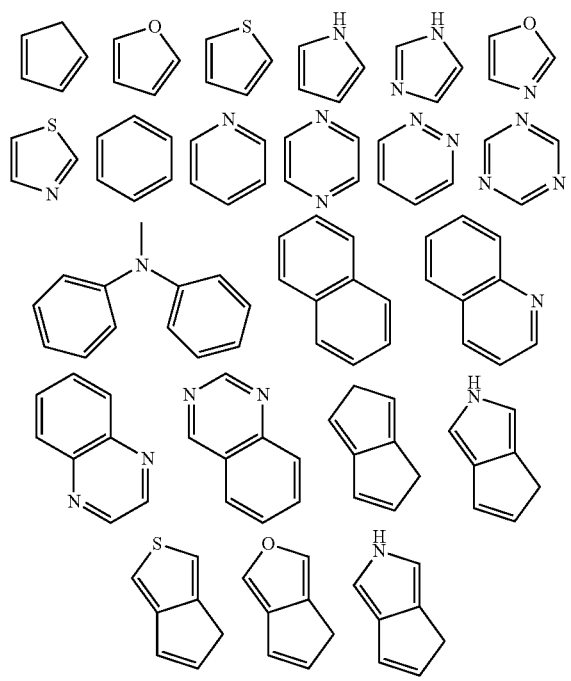

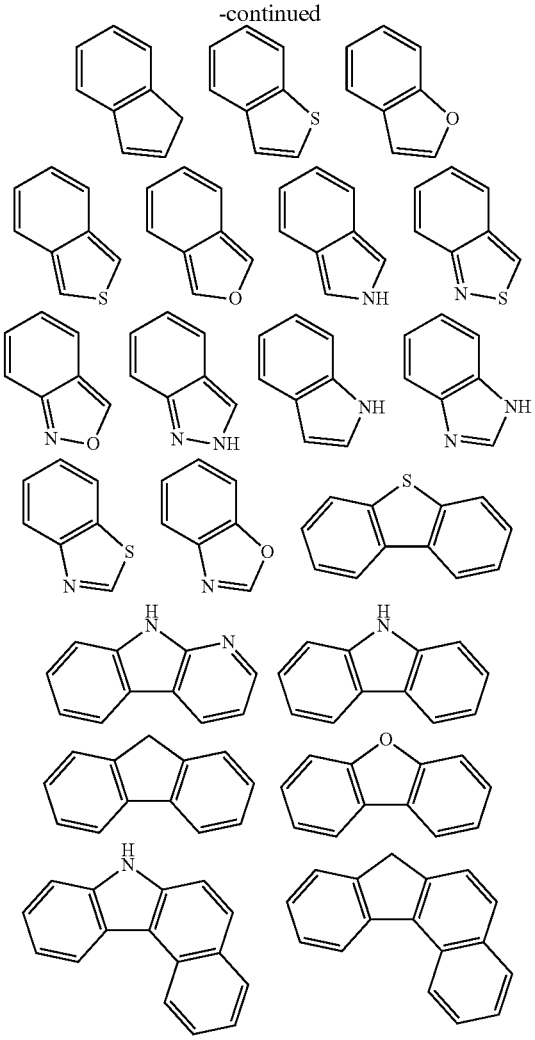

The cover layer 6 is disposed on a side of the second electrode 4 away from the first electrode 2, and the cover layer 6 has an ionic compound having a chemical formula of AX2, wherein A is selected from a divalent metal. X is selected from halogen. In this embodiment, the materials of the cover layer 6 and the light extraction layer 5 may be the same, and the ionic compound may be used as the ionic compound.

The divalent metal is one of zinc, magnesium, and tin, and the halogen is one of fluorine, chlorine, bromine, and iodine. The cover layer material is selected from the group consisting of ionic compounds AX2. A is selected from the group consisting of zinc, magnesium, and tin, and X is selected from the group consisting of fluorine, chlorine, bromine, and iodine. Specifically, the cover layer 6 may be selected from the group consisting of magnesium chloride, magnesium bromide, zinc chloride, zinc bromide, stannous chloride, and stannous bromide.

In this embodiment, material of the cover layer has a melting point of less than 750° C. and a boiling point of less than 1420° C.; preferably, the melting point is lower than 600° C., and the boiling point is lower than 1300° C.; preferably, the melting point is lower than 400° C., and the boiling point is lower than 750° C. The magnesium chloride has a melting point of 714° C. and a boiling point of 1412° C.; the magnesium bromide has a melting point of 700° C.

and a boiling point of 1230° C.; the zinc chloride has a melting point of 283° C. and a boiling point of 732° C.; the zinc bromide has a melting point of 394° C., and a boiling point of 697° C.; the stannous chloride has a melting point of 247° C., and a boiling point of 623° C.; stannous bromide has a melting point of 215° C., and a boiling point of 639° C.; compared to lithium fluoride (melting point 848° C., boiling point 1681° C.), such compounds have lower evaporation temperatures and faster evaporation rates, which reduces the difficulty of device fabrication.

The cover layer 6 has substantially no absorption in the visible range, and the extinction coefficient is less than 0.1 at 430 nm.

The cover layer 6 has a visible light transmittance of more than 70%; preferably, the transmittance is greater than 80%; more preferably, the transmittance is greater than 90%. The cover layer 6 may have a thickness of 10 nm to 300 nm; preferably, 10 to 200 nm.

Method Example 1

An embodiment of the present invention also provides a preparation method for preparing the thin film electroluminescent device 10, including the steps of:

A step of providing a conductive glass 1 having the first electrode 2 on a surface of the conductive glass 1 is provided. In details, providing the conductive glass 1 having the first electrode 2 on the surface of the conductive glass 1 including sequentially ultrasonically washing the conductive glass 1 using deionized water, acetone, or isopropanol, and then washing the conductive glass 1 using a plasma cleaner to improve a electrode work function.

The functional structural layer 3 is formed by a vacuum evaporation method in which the conductive glass 1 has one side of the first electrode 2. Specifically, the hole injection layer 3*a* is sequentially formed by a vacuum evaporation method, and when the material of the hole injection layer 3*a* is vapor-deposited, the vapor deposition rate is 1 Å/s, and the thickness of the hole injection layer 3*a* formed after the vapor deposition is 5 nm. The hole transport material was vapor-deposited on the hole injection layer 3*a* by a vacuum deposition method, and the hole transport layer 3*b* was formed to have a thickness of 80 nm. A material of the light-emitting layer 3*c* is evaporated on the hole transport layer 3*b*, the material of the light emitting layer 3*c* comprises a host material and a doping material, and the mass ratio of the host material to the dopant material is 7:1:–9:1. The thickness of the light emitting layer 3*c* formed was 40 nm. On the light emitting layer 3*c*, material of the electron transport layer 3*d* is deposited by vacuum evaporation, and the thickness of the electron transport layer 3*d* formed is 30 nm. On the electron transport layer 3*d*, material of the electron injection layer 3*e* is vacuum-deposited, and the thickness of the electron injection layer 3*e* formed is 1 nm.

In this embodiment, the structure of the material of the hole injection layer 3*a* is as follows:

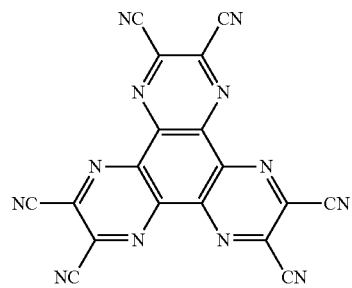 [SMILES: N#Cc1nc2c3nc(C#N)c(C#N)nc3c3nc(C#N)c(C#N)nc3c2nc1C#N]

The structure of the material of the hole transport layer 3*b* is as follows:

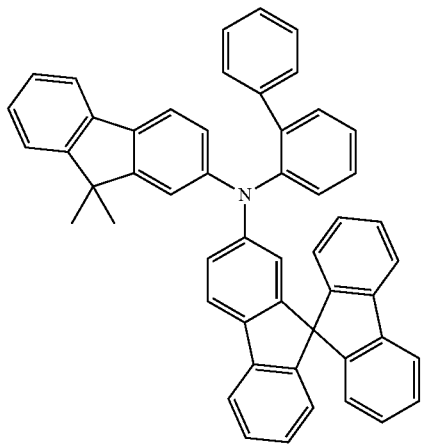 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

The structural formula of the host material of the light emitting layer 3*c* is as follows:

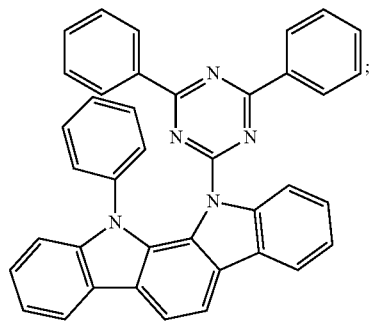 [SMILES: c1ccc(-c2nc(-c3ccccc3)nc(-n3c4ccccc4c4ccc5c6ccccc6n(-c6ccccc6)c5c43)n2)cc1]

The structural formula of the doping material of the light emitting layer 3*c* is as follows:

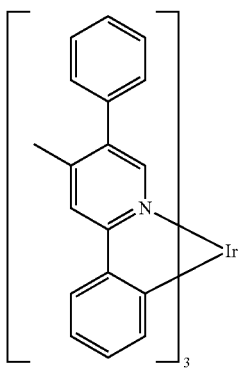

The electron transport layer 3d has two materials, and the mass ratio of the two materials is 1:1, and the structural formulas of the two materials are as follows:

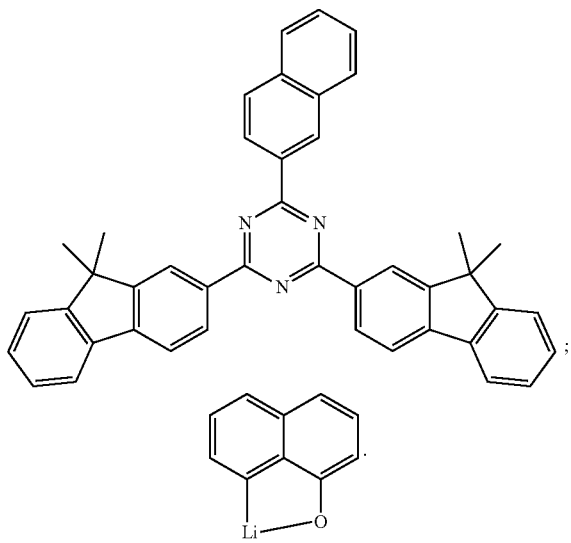

The material of the electron injection layer 3e is germanium.

Forming the second electrode 4 on a side of the functional structure layer 3 away from the first electrode 2 by vacuum evaporation is provided. Vacuum-depositing the cathode on the electron injection layer 3e is provided. In this embodiment, the cathode is a magnesium-silver alloy layer, the doping ratio of magnesium and silver is 9:1, and the thickness of the cathode is 15 nm.

Above the cathode, the material of the light extraction layer 5 was vapor-deposited by vacuum evaporation, and the thickness of the light extraction layer 5 is 60 nm. The material structure of the light extraction layer 5 is as follows:

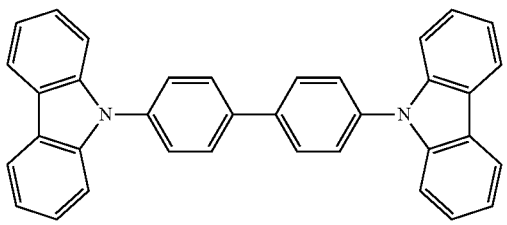 [SMILES: c1ccc2c(c1)c1ccccc1n2-c1ccc(-c2ccc(-n3c4ccccc4c4ccccc43)cc2)cc1]

Forming the cover layer 6 on the side of the second electrode 4 away from the first electrode 2 by vacuum evaporation is provided. Specifically, depositing the cover layer 6 on the light extraction layer 5 to form the cover layer 6. The cover layer 6 has a thickness of 50 nm.

The thin film electroluminescent device 10 is finally formed.

Method Example 2

The method example 2 differs from the method example 1 in that the material used for the cover layer 6 is zinc bromide, and finally the thin film electroluminescent device 10 is produced.

Method Example 3

The method example 3 differs from the method example 1 in that the material used for the cover layer 6 is tin chloride, and the thin film electroluminescent device 10 is finally produced.

Method Example 4

The method example 4 differs from the method example 1 in that the material used for the cover layer 6 is tin bromide, and the thin film electroluminescent device 10 is finally produced.

Comparative Example 1

The comparative example 1 differs from the method example 1 in that the material used for the cover layer 6 is lithium fluoride, and finally the thin film electroluminescent device 10 is produced.

The relative values of time required for the vapor deposition of the cover layer 6 of the same thickness and the relative values of the luminous efficiency of method example 2 and comparative example 1 are as follows, and are plotted as table 1:

TABLE 1

Relative values of time required for the vapor deposition of the cover layer 6 of the same thickness and the relative values of the luminous efficiency of method example 2 and comparative example 1.

| Item | Compound of cover layer 6 | Relative time required for evaporation of 50 nm cover layer 6 | Relative value of luminous efficiency |
|---|---|---|---|
| Method example 1 | ZnCl2 | 0.5 | 1.03 |
| Method example 2 | ZnBr2 | 0.45 | 1.04 |
| Method example 3 | SnCl2 | 0.5 | 1.03 |
| Method example 4 | SnBr2 | 0.6 | 1.03 |
| Comparative example 1 | LiF | 1 | 1 |

In table 1, the luminous efficiency is the data obtained when the current density is 10 mA/cm2. As can be seen from table 1, the compound involved in the electroluminescent device of the embodiment of the present invention has a lower melting point (less than 400° C.) and a boiling point (less than 750° C.) than lithium fluoride. Without affecting the efficiency of the device, the time required for evaporation of the cover layer 6 can be effectively reduced, the preparation efficiency of the device is improved, and the difficulty of device fabrication is reduced.

An embodiment of the present invention also provides an electronic device 100 having the thin film electroluminescent device 10. The main design point of the embodiment of the present invention lies in the thin film electroluminescent device 10, and other structures will not be described again. The electronic device 100 of the embodiment of the present invention includes all of the electronic devices 100 having the thin film electroluminescent device 10 of the embodiment of the present invention, including display devices, illumination devices, light sources, sensors, and the like.

The above are only the preferred embodiments of the present invention and are not intended to limit the present invention. Any modifications, equivalents, and improvements made within the spirit and scope of the present invention should be included in the scope of the present invention.

What is claimed is:

1. A thin film electroluminescent device, comprising:
a first electrode;
a functional structural layer disposed on the first electrode;
a second electrode disposed on the functional structural layer; and
a cover layer disposed on a side of the second electrode away from the first electrode, wherein the cover layer comprises an ionic compound having a chemical formula of $AX_2$, wherein A is selected from a divalent metal, and X is selected from halogen;
wherein the light emitting layer comprises a host material and a dopant material, the host material has the following structural formula:

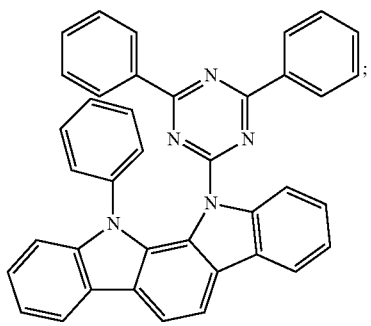 [SMILES: c1ccc(-c2nc(-c3ccccc3)nc(-n3c4ccccc4c4ccc5c6ccccc6n(-c6ccccc6)c5c43)n2)cc1]

the doping material has the following structural formula:

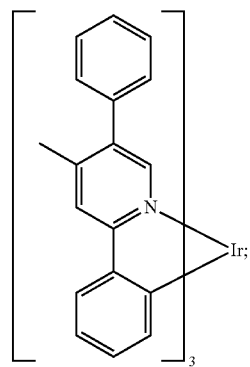

and
a mass ratio of the host material to the dopant material is 7:1: –9:1.

2. The thin film electroluminescent device according to claim 1, wherein the divalent metal is one of zinc, magnesium, and tin, and the halogen is one of fluorine, chlorine, bromine, and iodine.

3. The thin film electroluminescent device according to claim 1, wherein the cover layer has an extinction coefficient of visible light of 0.1 or less and a transmittance of visible light of 70% or more.

4. The thin film electroluminescent device according to claim 1, further comprising a light extraction layer disposed between the second electrode and the cover layer, wherein the cover layer is vacuum evaporated on the light extraction layer on a side of the light extraction layer away from the second electrode, and material for the light extraction layer comprises at least one selected from the group consisting of the ionic compound, a carbazole derivative, a diphenylfuran derivative, an arylamine derivative, and a triazine derivative.

5. The thin film electroluminescent device according to claim 1, wherein material for the first electrode and material of the second electrode comprise at least one of metal or a compound thereof, metal alloy, and conductive polymer.

6. The thin film electroluminescent device according to claim 1, wherein the functional structural layer comprises:
a hole injection layer disposed on the first electrode;
a hole transport layer disposed on the hole injection layer;
a light emitting layer disposed on the hole transport layer;
an electron transport layer disposed on the light emitting layer;
an electron injection layer disposed on the electron transport layer; and
the second electrode disposed on the electron injection layer.

7. A preparation method for preparing the thin film electroluminescent device according to claim 1, comprising:
providing a conductive glass having the first electrode on a surface of the conductive glass;
forming, by vacuum evaporation, the functional structural layer on the surface of the conductive glass having the first electrode;
forming, by vacuum evaporation, the second electrode on a side of the functional structure layer away from the first electrode; and
forming, by vacuum evaporation, the cover layer on the side of the second electrode away from the first electrode;
wherein the cover layer comprises the ionic compound having the chemical formula of $AX_2$, wherein A is selected from the divalent metal, and X is selected from halogen.

8. The method according to claim 7, wherein providing the conductive glass comprises sequentially ultrasonically washing the conductive glass using deionized water, acetone, or isopropanol, and then washing the conductive glass using a plasma cleaner, and forming the functional structure layer comprising sequentially forming a hole injection layer, a hole transport layer, a light emitting layer, an electron transport layer, and an electron injection layer by vacuum evaporation.

9. An electronic device comprising the thin film electroluminescent device according to claim 1.

* * * * *